US011443944B2

(12) United States Patent
Nagaoka et al.

(10) Patent No.: US 11,443,944 B2
(45) Date of Patent: Sep. 13, 2022

(54) METHOD OF GROWING SEMICONDUCTOR LAYERS, METHOD OF MANUFACTURING SEMICONDUCTOR DEVICE, AND METHOD OF GROWING BALK CRYSTAL

(71) Applicants: Tatsuji Nagaoka, Nagakute (JP); Hiroyuki Nishinaka, Kyoto (JP); Masahiro Yoshimoto, Kyoto (JP); Daisuke Tahara, Kyoto (JP)

(72) Inventors: Tatsuji Nagaoka, Nagakute (JP); Hiroyuki Nishinaka, Kyoto (JP); Masahiro Yoshimoto, Kyoto (JP); Daisuke Tahara, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 9 days.

(21) Appl. No.: 16/859,160

(22) Filed: Apr. 27, 2020

(65) Prior Publication Data
US 2020/0365402 A1    Nov. 19, 2020

(30) Foreign Application Priority Data

May 15, 2019    (JP) .............................. JP2019-092449

(51) Int. Cl.
*H01L 21/16*    (2006.01)
*H01L 21/02*    (2006.01)

(52) U.S. Cl.
CPC .... *H01L 21/02565* (2013.01); *H01L 21/0254* (2013.01); *H01L 21/0262* (2013.01);
(Continued)

(58) Field of Classification Search
CPC ......... H01L 21/02565; H01L 21/02378; H01L 21/02381; H01L 21/02389;
(Continued)

(56) References Cited

U.S. PATENT DOCUMENTS 8,415,180 B2 *    4/2013    Hashimoto ........... C30B 29/406
                                                                438/22
8,592,289 B2 *    11/2013    Hashimoto ............. H01L 33/16
                                                                438/478
(Continued)

FOREIGN PATENT DOCUMENTS

JP    2002-29897 A    1/2002
JP    2006-315947 A    11/2006
JP    2016-100592 A    5/2016

*Primary Examiner* — Jay C Kim
(74) *Attorney, Agent, or Firm* — Sughrue Mion, PLLC

(57) ABSTRACT

A method of growing semiconductor layers may include: growing a first semiconductor layer on a surface of a substrate at which a crystal layer is exposed, wherein the first semiconductor layer is different from the crystal layer in at least one of a material and a crystal structure; cutting the first semiconductor layer such that a cut surface of the first semiconductor layer extends from a front surface of the first semiconductor layer to a rear surface of the first semiconductor layer; and growing a second semiconductor layer on the cut surface of the first semiconductor layer, wherein the second semiconductor layer has a material and a crystal structure that are same as those of the first semiconductor layer.

14 Claims, 12 Drawing Sheets

(52) U.S. Cl.
CPC .. *H01L 21/02378* (2013.01); *H01L 21/02381* (2013.01); *H01L 21/02389* (2013.01); *H01L 21/02414* (2013.01); *H01L 21/02458* (2013.01); *H01L 21/02483* (2013.01)

(58) Field of Classification Search
CPC ......... H01L 21/02414; H01L 21/02458; H01L 21/02483; H01L 21/0254; H01L 21/0262
See application file for complete search history.

(56) References Cited

U.S. PATENT DOCUMENTS

| | | | | |
|---|---|---|---|---|
| 8,673,695 | B2* | 3/2014 | Okamura | B23K 26/53 |
| | | | | 438/149 |
| 9,431,489 | B2* | 8/2016 | Koshi | C30B 29/16 |
| 2002/0028564 | A1 | 3/2002 | Motoki et al. | |
| 2010/0270548 | A1* | 10/2010 | Ikemoto | H01L 33/0095 |
| | | | | 257/43 |
| 2014/0065360 | A1* | 3/2014 | D'Evelyn | C30B 29/403 |
| | | | | 428/141 |

* cited by examiner

METHOD OF GROWING SEMICONDUCTOR LAYERS, METHOD OF MANUFACTURING SEMICONDUCTOR DEVICE, AND METHOD OF GROWING BALK CRYSTAL

CROSS-REFERENCE TO RELATED APPLICATION

This application claims priority to Japanese Patent Application No. 2019-092449 filed on May 15, 2019, the contents of which are hereby incorporated by reference into the present application.

TECHNICAL FIELD

The technology disclosed herein relates to a method of growing semiconductor layers.

BACKGROUND

Japanese Patent Application Publication No. 2016-100592 describes a technology of growing a gallium oxide layer on a sapphire substrate.

SUMMARY

As described in Japanese Patent Application Publication No. 2016-100592, when a semiconductor layer (i.e., the gallium oxide layer), which is different from a crystal layer (i.e., the sapphire substrate) serving as a base, is grown on a surface of the crystal layer, crystal defects are generated at high densities in the grown semiconductor layer. The disclosure herein proposes a technology that enables formation of semiconductor layer having a low crystal defect density, when a semiconductor layer, which is different from a crystal layer serving as a base, is grown on the crystal layer.

A method of growing semiconductor layers disclosed herein may comprise: growing a first semiconductor layer on a surface of a substrate at which a crystal layer is exposed, wherein the first semiconductor layer is different from the crystal layer in at least one of a material and a crystal structure; cutting the first semiconductor layer such that a cut surface of the first semiconductor layer extends from a front surface of the first semiconductor layer to a rear surface of the first semiconductor layer; and growing a second semiconductor layer on the cut surface of the first semiconductor layer, wherein the second semiconductor layer has a material and a crystal structure that are same as those of the first semiconductor layer.

In this manufacturing method, the first semiconductor layer is grown on the surface of the substrate (i.e., the surface of the crystal layer). Since the first semiconductor layer is different from the crystal layer in at least one of the material and the crystal structure, crystal defects are generated in the first semiconductor layer to be grown. Most of the crystal defects generated in the growing first semiconductor layer extend long in a direction along which the first semiconductor layer is grown (i.e., a thickness direction of the first semiconductor layer). After the growth of the first semiconductor layer, the first semiconductor layer is cut such that the cut surface of the first semiconductor layer extends from the front surface of the first semiconductor layer to the rear surface thereof. Cutting the first semiconductor layer as such is less likely to expose the crystal defects in the first semiconductor layer to the cut surface of the first semiconductor layer, because the crystal defects extend long in the thickness direction of the first semiconductor layer. That is, there are few crystal defects exposed at the cut surface of the first semiconductor layer. Subsequently, the second semiconductor layer, which has the same material and crystal structure as the first semiconductor layer, is grown on the cut surface of the first semiconductor layer. Since there are few crystal defects exposed at the cut surface of the first semiconductor layer, crystal defects are less likely to be formed in the second semiconductor layer growing on the cut surface of the first semiconductor layer. Therefore, the second semiconductor layer having a low crystal defect density can be obtained by this method.

DETAILED DESCRIPTION

First Embodiment

Figure 1:
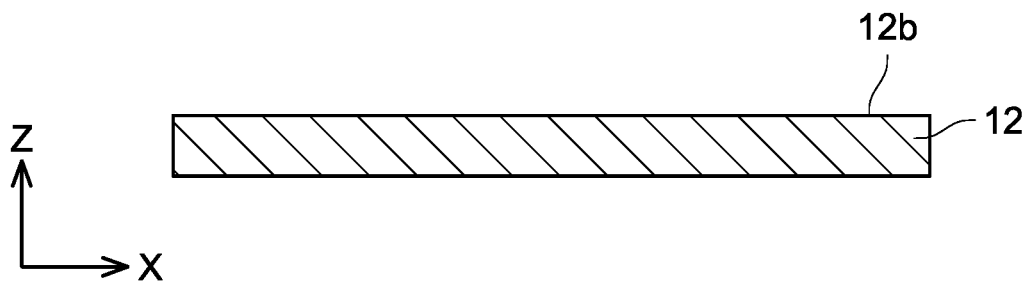
FIG. 1 is an explanatory diagram of a growing method in first and second embodiments.

In a growing method of a first embodiment, a semiconductor layer is grown on a wafer 12 shown in FIG. 1 which serves as a base. An entirety of the wafer 12 is constituted of magnesium oxide (MgO).

Figure 2:
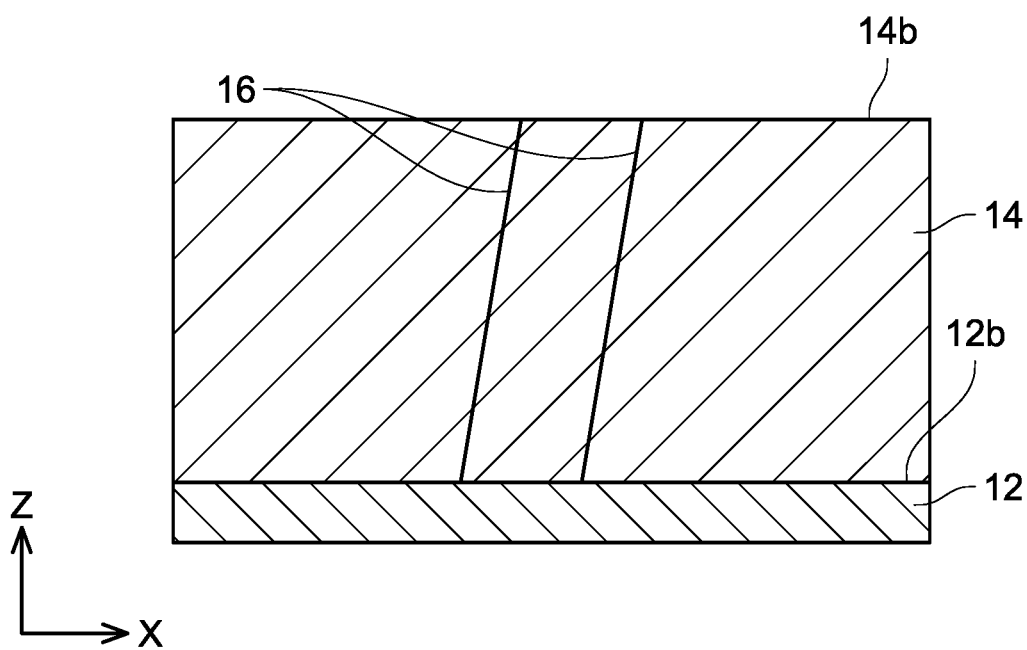
FIG. 2 is an explanatory diagram of the growing method in the first and second embodiments.

Firstly, as shown in FIG. 2, a semiconductor layer 14 constituted of ε-gallium oxide (ε-Ga$_2$O$_3$) is grown on an upper surface 12b of the wafer 12. Here, the semiconductor layer 14 is grown on the wafer 12 by a mist chemical vapor deposition (CVD). The mist CVD is a technology of growing a film on a surface of a wafer by supplying mist to the surface of the wafer while heating the wafer. The mist is constituted of a solution containing a raw material of the film to be grown. When the mist adheres to the surface of the wafer, the solution is heated and reacts on the surface of the wafer, as a result of which the film is grown on the surface of the wafer. The mist CVD can grow a film at relatively low temperature, and hence is suitable for growth of a metastable semiconductor layer of ε-gallium oxide, for example. Hereinbelow, a direction along which the semiconductor layer 14 is epitaxially grown (a thickness direction of the semiconductor layer 14) will be termed a z direction, and a direction orthogonal to the z direction will be termed an x direction. Since the material of the semiconductor layer 14 (ε-gallium oxide) is different from the material of the wafer 12 (magnesium oxide), crystal defects 16 are generated in the semiconductor layer 14 when the semiconductor layer 14 is grown, as shown in FIG. 2. The crystal defects 16 are formed to extend long in the direction along which the semiconductor layer 14 is grown (i.e., the z direction). Therefore, a longitudinal direction of the crystal defects 16 is inclined to the z direction only by a small angle, and the crystal defects 16 thus extend substantially parallel to the z direction.

Figure 3:
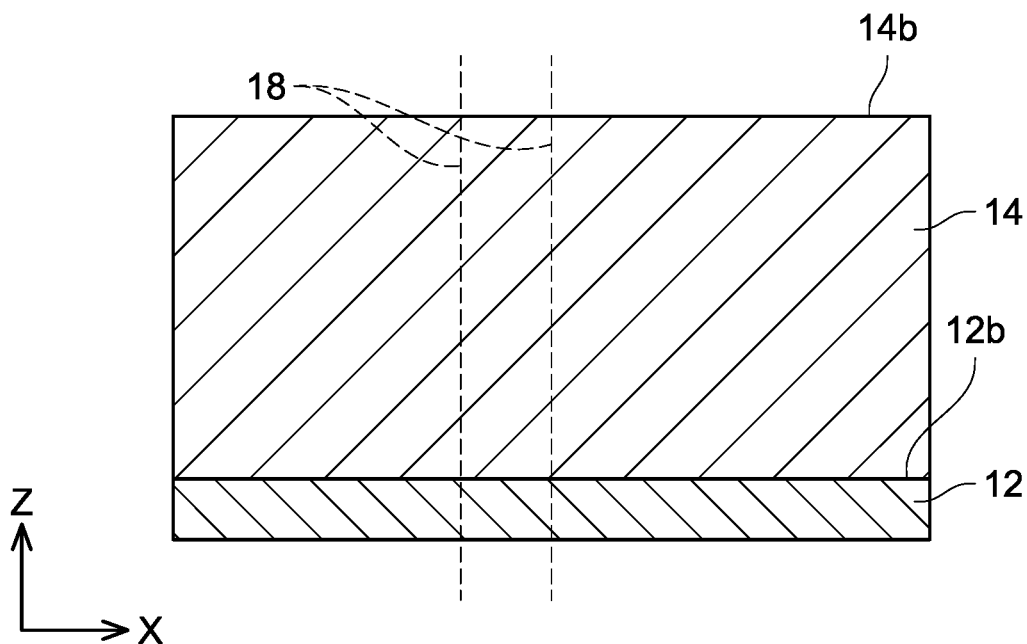
FIG. 3 is an explanatory diagram of the growing method in the first and second embodiments.
Figure 4:
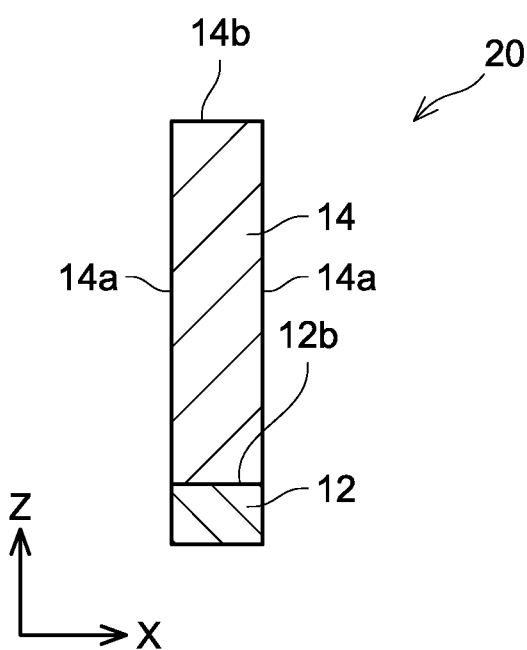
FIG. 4 is an explanatory diagram of the growing method in the first and second embodiments.

Next, the semiconductor layer 14 and the wafer 12 are cut along the thickness direction of the semiconductor layer 14. In other words, the semiconductor layer 14 and the wafer 12 are cut along cut lines 18 in FIG. 3 (cut lines extending from an upper surface 14b of the semiconductor layer 14 to a lower surface thereof (i.e., the upper surface 12b of the wafer 12)). Here, the semiconductor layer 14 and the wafer 12 can be cut by machining with a blade saw, a wire saw, or the like. The semiconductor layer 14 and the wafer 12 may be cut by processing with a laser or an etching technology. Although the cut lines 18 in FIG. 3 are perpendicular to the upper surface 14b of the semiconductor layer 14, the semiconductor layer 14 and the wafer 12 may be cut along a direction inclined to the upper surface 14b of the semiconductor layer 14. In other words, the semiconductor layer 14 and the wafer 12 can be cut along any direction, as long as the cut surface of the semiconductor layer 14 extends from the upper surface 14b to the lower surface of the semiconductor layer 14. For example, the semiconductor layer 14 and the wafer 12 may be cut such that a certain crystal surface is exposed at the cut surface. Cutting the semiconductor layer 14 and the wafer 12 produces a cut piece 20 shown in FIG. 4. Both side surfaces of the cut piece 20 each correspond to a cut surface 14a.

As described above, the crystal defects 16 formed when the semiconductor layer 14 was grown are present in the semiconductor layer 14. The crystal defects 16 extend substantially parallel to the z direction, and thus extend substantially parallel to the cut surfaces 14a. The crystal defects 16 are therefore less likely to be exposed at the cut surfaces 14a. There are extremely few crystal defects 16 exposed at the cut surfaces 14a, and each cut surface 14a has a low crystal defect density.

Figure 5:
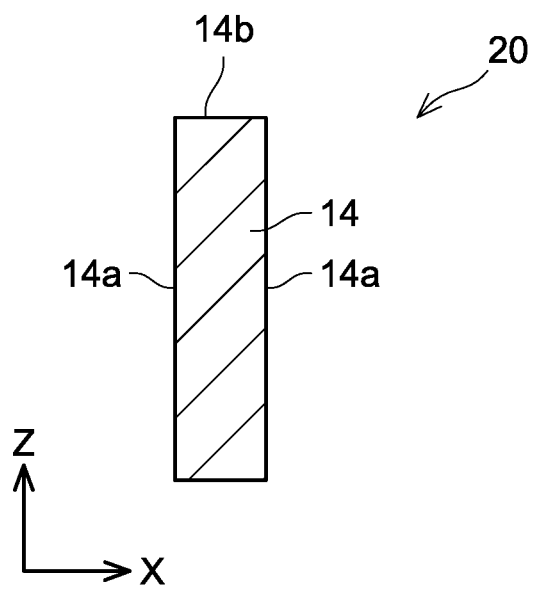
FIG. 5 is an explanatory diagram of the growing method in the first and second embodiments.

Next, as shown in FIG. 5, the wafer 12 (i.e., the magnesium oxide layer) is removed from the semiconductor layer 14. The wafer 12 can be removed, for example, by etching or polishing. Furthermore, the cut surfaces 14a of the semiconductor layer 14 are polished by chemical mechanical polishing (CMP). The cut surfaces 14a are thereby smoothed.

Figure 6:
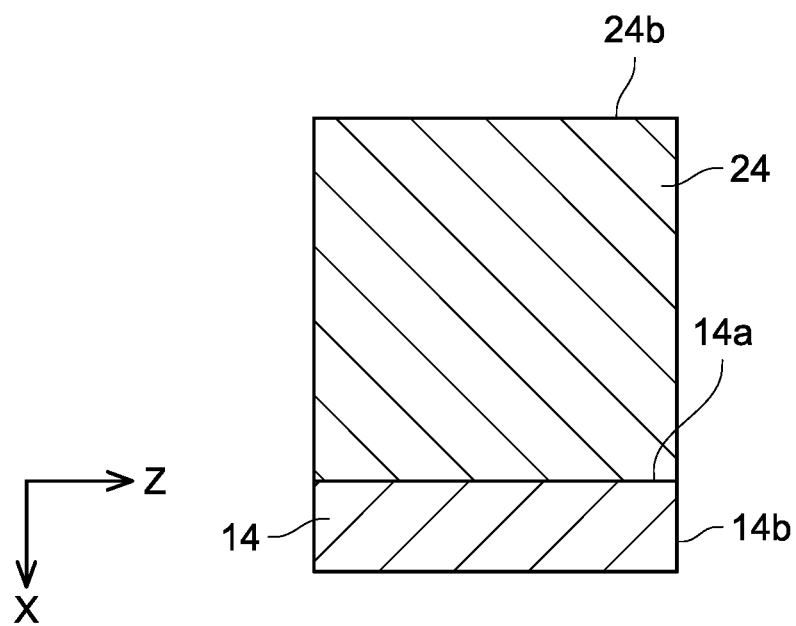
FIG. 6 is an explanatory diagram of the growing method in the first and second embodiments.

Next, as shown in FIG. 6, a semiconductor layer 24 constituted of ε-gallium oxide is grown on one of the cut surfaces 14a of the semiconductor layer 14. In other words, the semiconductor layer 24 that is constituted of the same material and the same crystal structure as the semiconductor layer 14 is homoepitaxially grown on one of the cut surfaces 14a of the semiconductor layer 14. Here, the semiconductor layer 24 is grown by the mist CVD. The cut surface 14a of the semiconductor layer 14 has a low crystal defect density and there is no mismatch in the lattice constant between the semiconductor layer 14 and the semiconductor layer 24, so crystal defects are less likely to be formed in the growing semiconductor layer 24. As such, the semiconductor layer 24 having a low crystal defect density can be formed.

A semiconductor device can be manufactured using the semiconductor layer 24 grown as described above. Using the semiconductor layer 24 having a low crystal defect density enables manufacturing of a highly reliable semiconductor device.

Relationships between constituent elements in the first embodiment and constituent elements in the claims will be described. The wafer 12 (the magnesium oxide layer) in the first embodiment is an example of a crystal layer in the claims. The semiconductor layer 14 in the first embodiment is an example of a first semiconductor layer in the claims. The semiconductor layer 24 in the first embodiment is an example of a second semiconductor layer in the claims.

Second Embodiment

Figure 7:
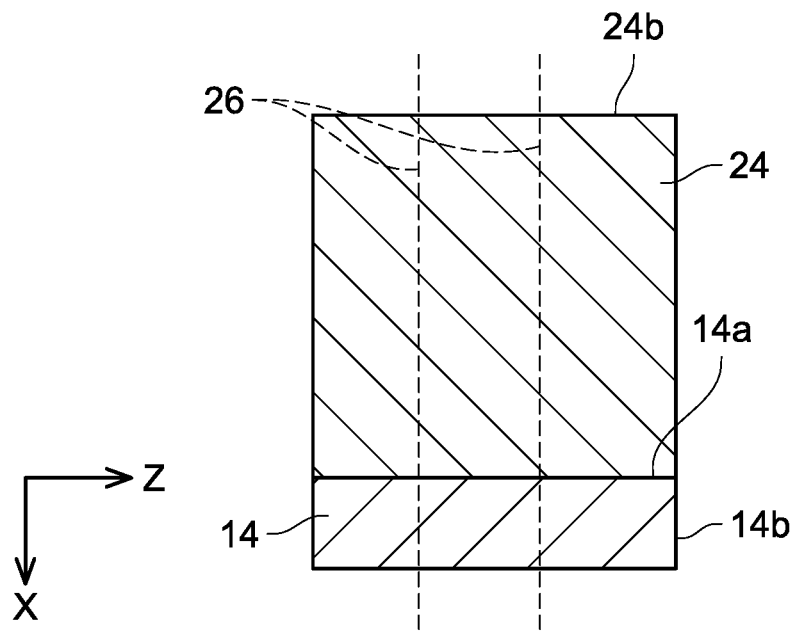
FIG. 7 is an explanatory diagram of the growing method in the second embodiment.
Figure 8:
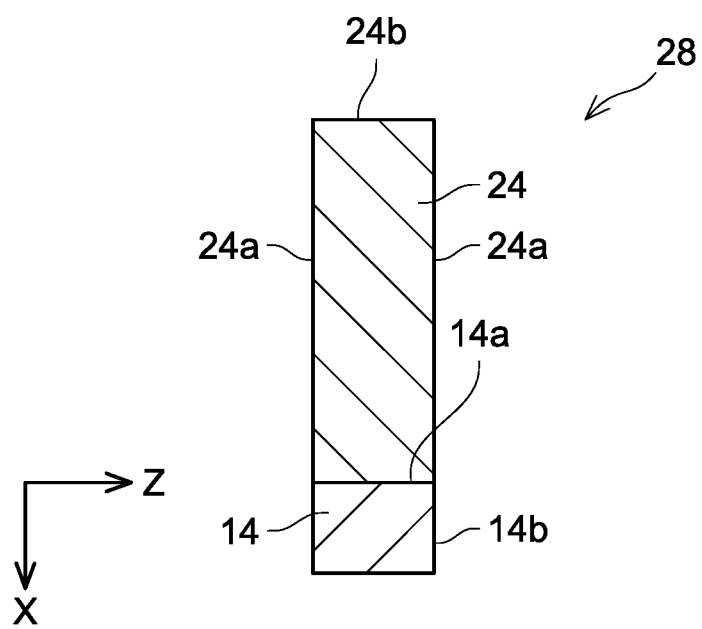
FIG. 8 is an explanatory diagram of the growing method in the second embodiment.

In a growing method of a second embodiment, the processes of FIGS. 1 to 6 are performed as in the first embodiment. Next, the semiconductor layer 24 and the semiconductor layer 14 are cut along a thickness direction (a growth direction) of the semiconductor layer 24. In other words, the semiconductor layer 24 and the semiconductor layer 14 are cut along cut lines 26 in FIG. 7 (cut lines extending from an upper surface 24b of the semiconductor layer 24 to a lower surface thereof (i.e., the cut surface 14a of the semiconductor layer 14)). The semiconductor layer 24 and the semiconductor layer 14 may be cut along a direction inclined to the upper surface 24b of the semiconductor layer 24. Cutting the semiconductor layer 24 and the semiconductor layer 14 produces a cut piece 28 shown in FIG. 8. Both side surfaces of the cut piece 28 each correspond to a cut surface 24a.

As described above, crystal defects are less likely to be formed in the semiconductor layer 24 when the semiconductor layer 24 is grown. That said, crystal defects are formed at low densities in the semiconductor layer 24 when the semiconductor layer 24 is grown. The crystal defects in the semiconductor layer 24 are formed to extend long in the direction along which the semiconductor layer 24 is grown (i.e., the x direction). A longitudinal direction of the crystal defects in the semiconductor layer 24 therefore is inclined to the x direction only by a small angle, and thus the crystal defects in the semiconductor layer 24 extend substantially parallel to the x direction. In other words, the crystal defects in the semiconductor layer 24 extend substantially parallel to the cut surfaces 24a. The crystal defects are therefore less likely to be exposed at the cut surfaces 24a. There are extremely few crystal defects exposed at the cut surfaces 24a, and each cut surface 24a has a low crystal defect density.

Next, the semiconductor layer 14 (i.e., the ε-gallium oxide layer grown on the upper surface 12b of the wafer 12) is removed from the semiconductor layer 24. Furthermore, the cut surfaces 24a of the semiconductor layer 24 are polished by the CMP. The cut surfaces 24a are thereby smoothed.

Figure 9:
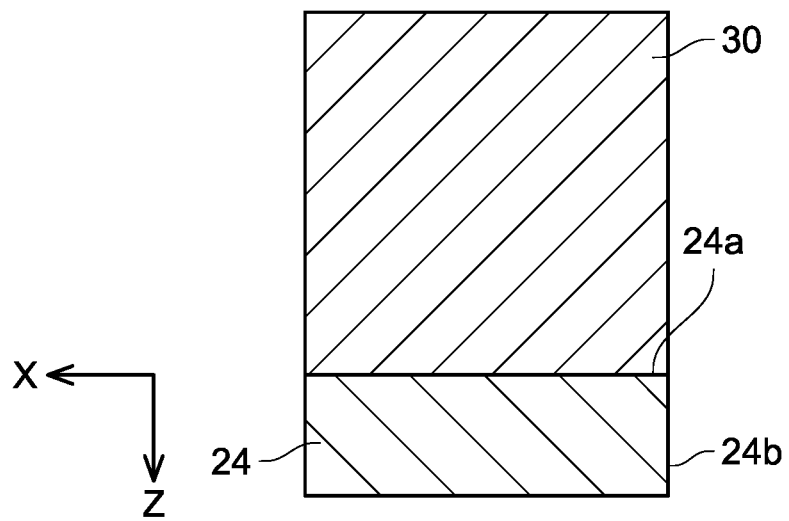
FIG. 9 is an explanatory diagram of the growing method in the second embodiment.

Next, as shown in FIG. 9, a semiconductor layer 30 constituted of ε-gallium oxide is grown on one of the cut surfaces 24a of the semiconductor layer 24. In other words, the semiconductor layer 30 that is constituted of the same material and the same crystal structure as the semiconductor layer 24 is homoepitaxially grown on one of the cut surfaces 24a of the semiconductor layer 24. Here, the semiconductor layer 30 is grown by the mist CVD. The cut surface 24a of the semiconductor layer 24 has a low crystal defect density and there is no mismatch in the lattice constant between the semiconductor layer 24 and the semiconductor layer 30, so crystal defects are less likely to be formed in the growing semiconductor layer 30. Therefore, the semiconductor layer 30 having a low crystal defect density can be formed.

A semiconductor device can be manufactured using the semiconductor layer 30 grown as described above. Using the semiconductor layer 30 having a low crystal defect density enables manufacturing of a highly reliable semiconductor device.

By performing twice the cutting of semiconductor layer and the growth of another semiconductor layer on the cut surface as in the second embodiment, the semiconductor layer 30 having a lower crystal defect density can be formed. The cutting of semiconductor layer and the growing of another semiconductor layer on the cut surface may be performed three times or more to form a semiconductor layer having a much lower crystal defect density.

Relationships between constituent elements in the second embodiment and constituent elements in the claims will be described. The wafer 12 (the magnesium oxide layer) in the second embodiment is an example of the crystal layer in the claims. The semiconductor layer 14 in the second embodiment is an example of the first semiconductor layer in the claims. The semiconductor layer 24 in the second embodiment is an example of the second semiconductor layer in the claims. The semiconductor layer 30 in the second embodiment is an example of a third semiconductor layer in the claims. In the second embodiment, the cut piece 20 shown in FIG. 5 can be regarded as a substrate in the claims. In this case, the semiconductor layer 14 in the second embodiment is an example of the crystal layer in the claims, the semiconductor layer 24 in the second embodiment is an example of the first semiconductor layer in the claims, and the semiconductor layer 30 in the second embodiment is an example of the second semiconductor layer in the claims.

In the first and second embodiments described above, the wafer 12 is constituted of magnesium oxide. However, the wafer 12 may be constituted of α-aluminum oxide (α-$Al_2O_3$), gallium nitride (GaN), aluminum nitride (AlN), silicon carbide (SiC), yttria-stabilized zirconia (YSZ), nickel oxide (NiO), strontium titanate ($SrTiO_3$), lithium niobate ($LiNbO_3$), lithium tantalate ($LiTaO_3$), tin oxide ($SnO_2$), titanium oxide ($TiO_2$), β-gallium oxide (β-$Ga_2O_3$), or gadolinium gallium garnet ($Gd_3Ga_5O_{12}$). Even with the wafer 12 constituted of any of these materials, a semiconductor layer constituted of ε-gallium oxide can be suitably grown thereon.

Moreover, in the first and second embodiments described above, the wafer 12 is removed from the semiconductor layer 14 after the cutting of the wafer 12 and the semiconductor layer 14. However, the wafer 12 may be removed from the semiconductor layer 14 before the cutting, and the semiconductor layer 14 may be cut after the removal of the wafer 12.

Moreover, in the first and second embodiments described above, each of the semiconductor layers may be doped with n-type or p-type impurities.

Third Embodiment

Figure 10:
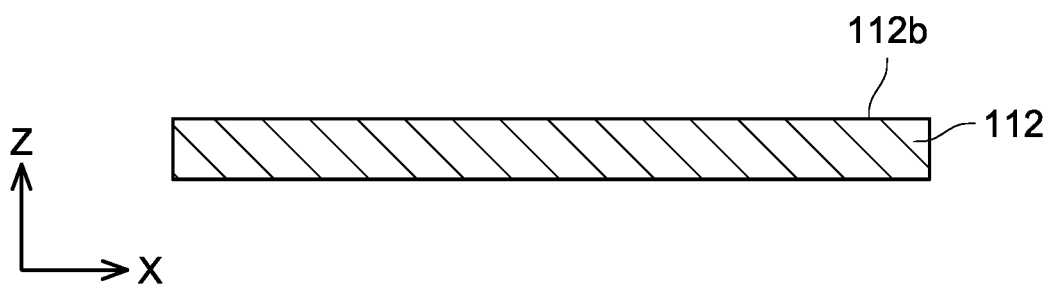
FIG. 10 is an explanatory diagram of a growing method in a third embodiment.

In a growing method of a third embodiment, a semiconductor device is manufactured from a wafer 112 shown in FIG. 10. An entirety of the wafer 112 is constituted of α-aluminum oxide (α-$Al_2O_3$). In other words, the wafer 112 is a sapphire substrate.

Figure 11:
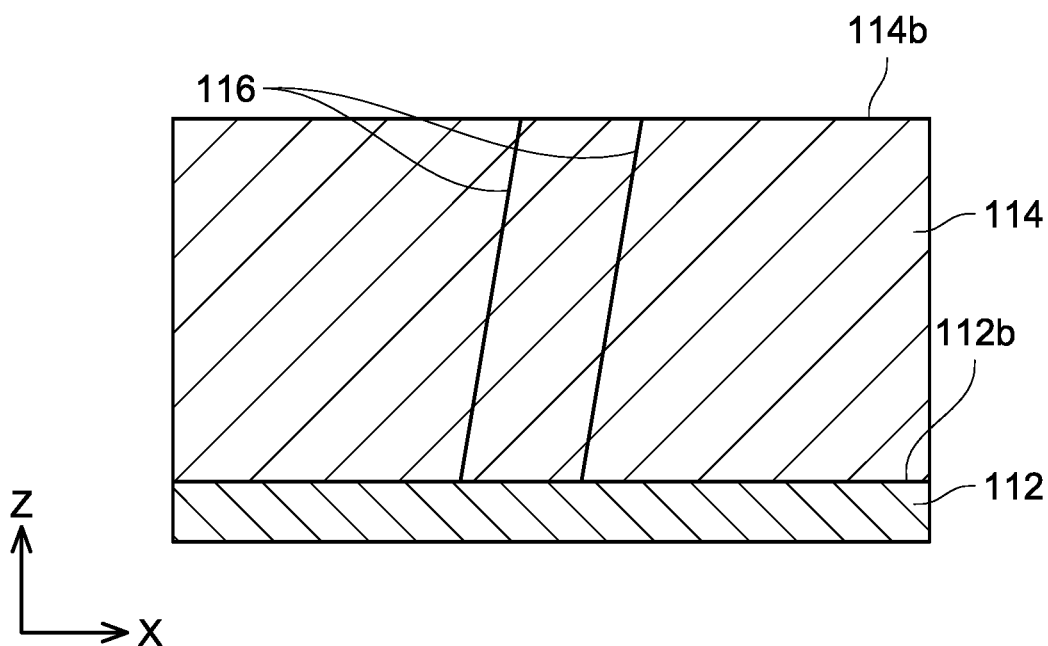
FIG. 11 is an explanatory diagram of the growing method in the third embodiment.

Firstly, as shown in FIG. 11, a semiconductor layer 114 constituted of α-gallium oxide (α-$Ga_2O_3$) is grown on an upper surface 112b of the wafer 112. At this time, the semiconductor layer 114 is doped with silicon (Si) at high concentrations, as a result of which the semiconductor layer 114 of $n^+$-type is formed. Here, the semiconductor layer 114 is grown on the wafer 112 by a hydride vapor phase epitaxy (hereinafter termed HVPE). The HVPE can grow a good-quality crystal at high crystal growth rate, and hence is useful for forming the semiconductor layer 114 that is thick. Hereinbelow, a direction along which the semiconductor layer 114 is epitaxially grown (a thickness direction of the semiconductor layer 114) will be termed a z direction, and a direction orthogonal to the z direction will be termed an x direction. Since the material of the semiconductor layer 114 (α-gallium oxide) is different from the material of the wafer 112 (α-aluminum oxide), crystal defects 116 are generated in the semiconductor layer 114 when the semiconductor layer 114 is grown, as shown in FIG. 11. The crystal defects 116 are formed to extend long in the direction along which the semiconductor layer 114 is grown (i.e., the z direction). Therefore, a longitudinal direction of the crystal defects 116 is inclined to the z direction only by a small angle, and thus the crystal defects 116 extend substantially parallel to the z direction.

Figure 12:
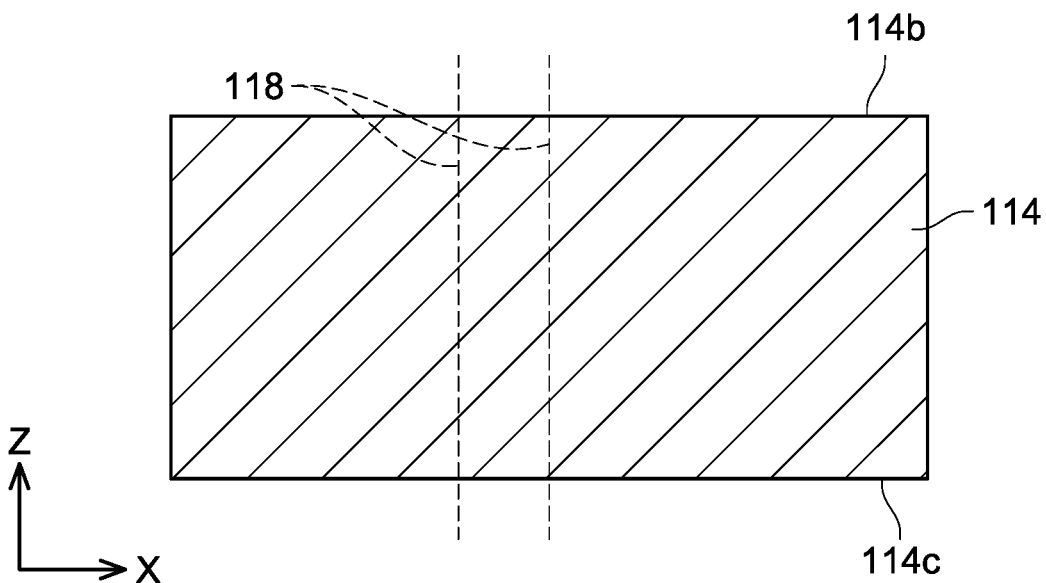
FIG. 12 is an explanatory diagram of the growing method in the third embodiment.

Next, as shown in FIG. 12, the wafer 112 is removed from the semiconductor layer 114. Here, the wafer 112 is peeled from the semiconductor layer 114 taking advantage of fragility of a junction between the semiconductor layer 114 (α-gallium oxide) and the wafer 112 (α-aluminum oxide).

Figure 13:
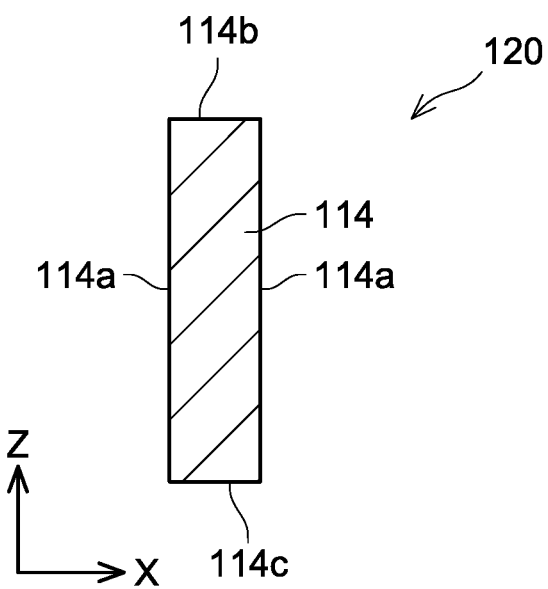
FIG. 13 is an explanatory diagram of the growing method in the third embodiment.

Next, the semiconductor layer 114 is cut along the thickness direction of the semiconductor layer 114. In other words, the semiconductor layer 114 is cut along cut lines 118 in FIG. 12 (cut lines extending from an upper surface 114b of the semiconductor layer 114 to a lower surface 114c thereof). Although the cut lines 118 in FIG. 12 are perpendicular to the upper surface 114b of the semiconductor layer 114, the semiconductor layer 114 may be cut along a direction inclined to the upper surface 114b of the semiconductor layer 114. In other words, the semiconductor layer 114 can be cut along any direction, as long as the cut surface of the semiconductor layer 114 extends from the upper surface 114b to the lower surface 114c of the semiconductor layer 114. For example, the semiconductor layer 114 may be cut such that a certain crystal surface is exposed at the cut surface. Cutting the semiconductor layer 114 produces a cut piece 120 shown in FIG. 13. Both side surfaces of the cut piece 120 each correspond to a cut surface 114a.

As described above, the crystal defects 116 formed when the semiconductor layer 114 was grown are present in the semiconductor layer 114. The crystal defects 116 extend substantially parallel to the z direction, and thus extend substantially parallel to the cut surfaces 114a. The crystal defects 116 are therefore less likely to be exposed at the cut surfaces 114a. There are extremely few crystal defects 116 exposed at the cut surfaces 114a, and thus each cut surface 114a has a low crystal defect density.

Next, the cut surfaces 114a of the semiconductor layer 114 are polished by the CMP. The cut surfaces 114a are thereby smoothed.

Figure 14:
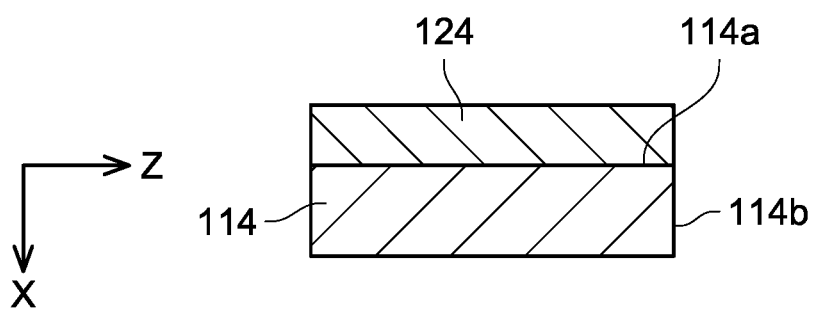
FIG. 14 is an explanatory diagram of the growing method in the third embodiment.

Next, as shown in FIG. 14, a semiconductor layer 124 constituted of α-gallium oxide is grown on one of the cut surfaces 114a of the semiconductor layer 114. In other words, the semiconductor layer 124 that is constituted of the same material and the same crystal structure as the semiconductor layer 114 is homoepitaxially grown on one of the cut surfaces 114a of the semiconductor layer 114. At this time, the semiconductor layer 124 is doped with tin (Sn) at low concentrations, as a result of which the semiconductor layer 124 of n⁻-type is formed. Here, the semiconductor layer 124 is grown by the mist CVD. The cut surface 114a of the semiconductor layer 114 has a low crystal defect density and there is no mismatch in the lattice constant between the semiconductor layer 114 and the semiconductor layer 124, so crystal defects are less likely to be formed in the growing semiconductor layer 124. Therefore, the semiconductor layer 124 having a low crystal defect density can be formed.

A semiconductor device can be manufactured using the semiconductor layer 124 grown as described above. Using the semiconductor layer 124 having a low crystal defect density enables manufacturing of a highly reliable semiconductor device. For example, a vertical semiconductor device can be manufactured by disposing an electrode that is in Schottky contact with the n⁻-type semiconductor layer 124.

Relationships between constituent elements in the third embodiment and constituent elements in the claims will be described. The wafer 112 (the α-aluminum oxide layer) in the third embodiment is an example of the crystal layer in the claims. The semiconductor layer 114 in the third embodiment is an example of the first semiconductor layer in the claims. The semiconductor layer 124 in the third embodiment is an example of the second semiconductor layer in the claims.

In the third embodiment described above, the wafer 112 is constituted of α-aluminum oxide. However, the wafer 112 may be constituted of α-iron oxide (α-Fe$_2$O$_3$). Even with the wafer 112 constituted of α-iron oxide, a semiconductor layer constituted of α-gallium oxide can be suitably grown thereon.

Moreover, in the third embodiment described above, the semiconductor layer 114 is cut after the removal of the wafer 112 from the semiconductor layer 114. However, the semiconductor layer 114 and the wafer 112 may be cut before the removal of the wafer 112, and subsequently the wafer 112 may be removed from the semiconductor layer 114.

Moreover, in the third embodiment described above, each of the semiconductor layers is doped with n-type impurities, however, each of the semiconductor layers may be doped with p-type impurities.

Moreover, in the first to third embodiments described above, the semiconductor layers 14, 114 are grown directly on the upper surfaces of the wafers 12, 112, however, crystal layers (e.g., buffer layers) may be formed on the upper surfaces of the wafers 12, 112 and the semiconductor layers 14, 114 may be grown on the crystal layers.

Moreover, in the first to third embodiments described above, the wafers 12, 112 or the crystal layers (e.g., buffer layers) may be constituted of spinel (MGAl$_2$O$_4$). In this case, the semiconductor layers 14, 24, 30, 114, 124 may be constituted of γ-gallium oxide. Using a crystal layer constituted of spinel as a base enables suitable growth of a metastable γ-gallium oxide layer.

Fourth Embodiment

Figure 15:
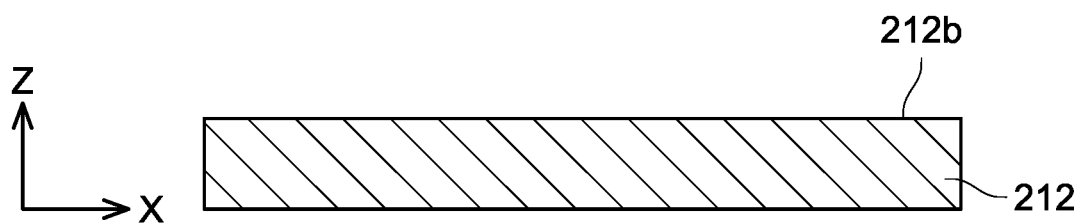
FIG. 15 is an explanatory diagram of a growing method in a fourth embodiment.

In a growing method of a fourth embodiment, a semiconductor layer is grown on a wafer 212 shown in FIG. 15 which serves as a base. An entirety of the wafer 212 is constituted of α-aluminum oxide.

Figure 16:
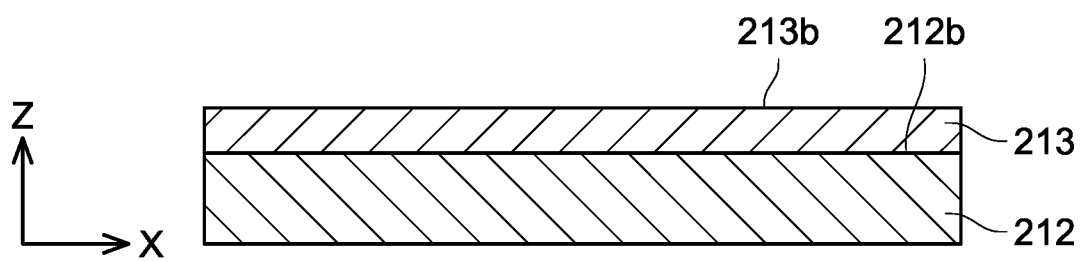
FIG. 16 is an explanatory diagram of the growing method in the fourth embodiment.

Firstly, as shown in FIG. 16, a buffer layer 213 constituted of aluminum nitride (AlN) is grown on an upper surface 212b of the wafer 212. Here, the buffer layer 213 is grown by a metal organic chemical vapor deposition (MOCVD). Hereinbelow, a direction along which the buffer layer 213 is epitaxially grown (a thickness direction of the buffer layer 213) will be termed a z direction, and a direction orthogonal to the z direction will be termed an x direction.

Figure 17:
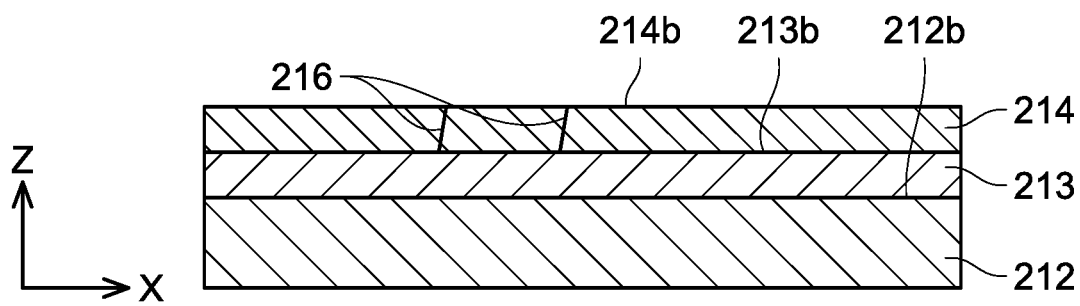
FIG. 17 is an explanatory diagram of the growing method in the fourth embodiment.

Next, as shown in FIG. 17, a semiconductor layer 214 constituted of gallium nitride (GaN) is grown on an upper surface 213b of the buffer layer 213. Here, the semiconductor layer 214 is grown by the MOCVD. Since the material of the semiconductor layer 214 (gallium nitride) is different from the material of the buffer layer 213 (aluminum nitride), crystal defects 216 are generated in the semiconductor layer 214 when the semiconductor layer 214 is grown, as shown in FIG. 17. The crystal defects 216 are formed to extend long in a direction along which the semiconductor layer 214 is grown (i.e., the z direction). Therefore, a longitudinal direction of the crystal defects 216 is inclined to the z direction only by a small angle, and thus the crystal defects 216 extend substantially parallel to the z direction. Growing the semiconductor layer 214 at low growth rate by the MOCVD can suppress generation of the crystal defects 216. That said, the crystal defects 216 are formed in the semiconductor layer 214.

Figure 18:
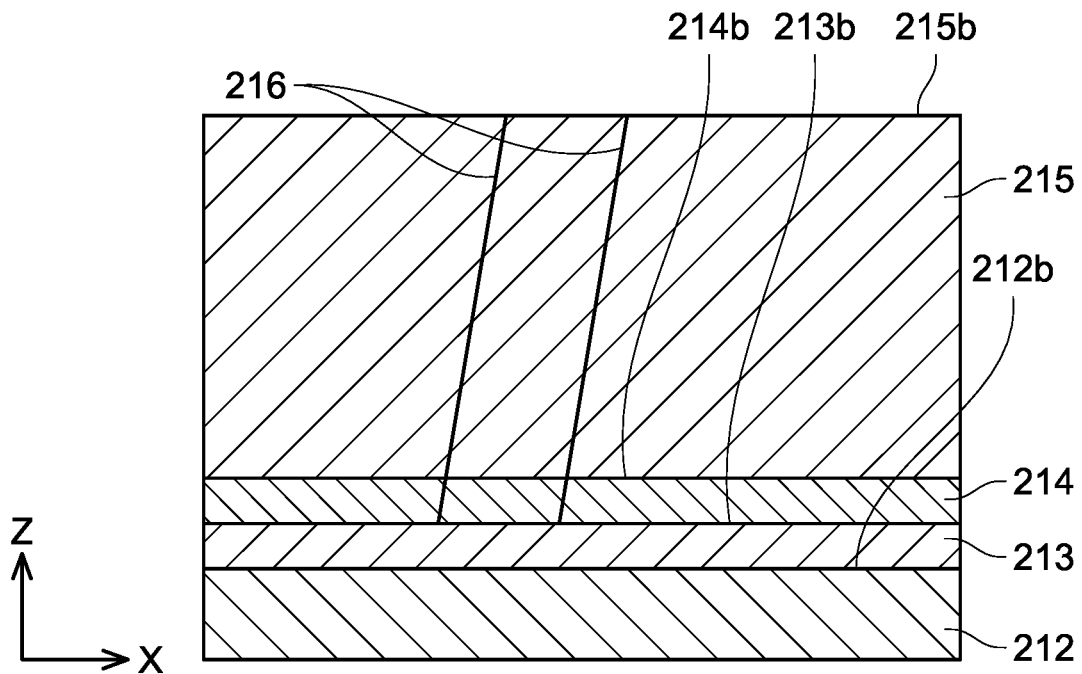
FIG. 18 is an explanatory diagram of the growing method in the fourth embodiment.

Next, as shown in FIG. 18, a semiconductor layer 215 constituted of gallium nitride is grown on an upper surface 214b of the semiconductor layer 214. In other words, the semiconductor layer 215 that is constituted of the same material and the same crystal structure as the semiconductor layer 214 is homoepitaxially grown on the upper surface 214b of the semiconductor layer 214. Here, the semiconductor layer 215 is grown by the HVPE at high grow rate. The crystal defects 216 are formed in the semiconductor layer 215 as well, and the crystal defects 216 in the semiconductor layer 215 extend to be continuous with those in the semiconductor layer 214.

Figure 19:
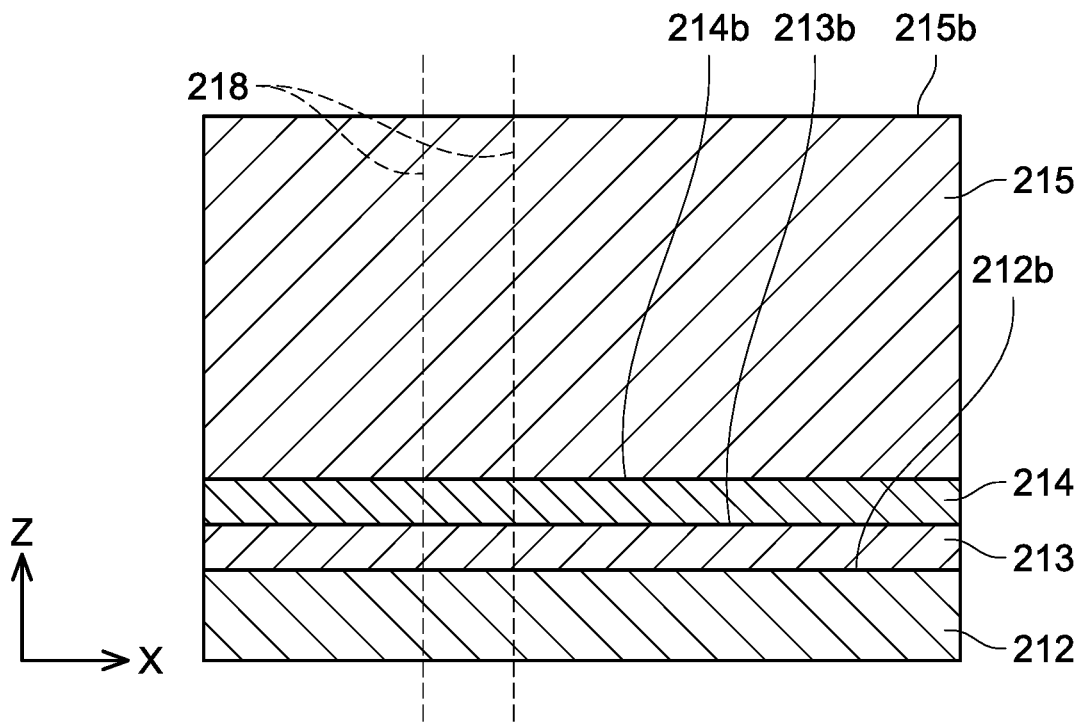
FIG. 19 is an explanatory diagram of the growing method in the fourth embodiment.
Figure 20:
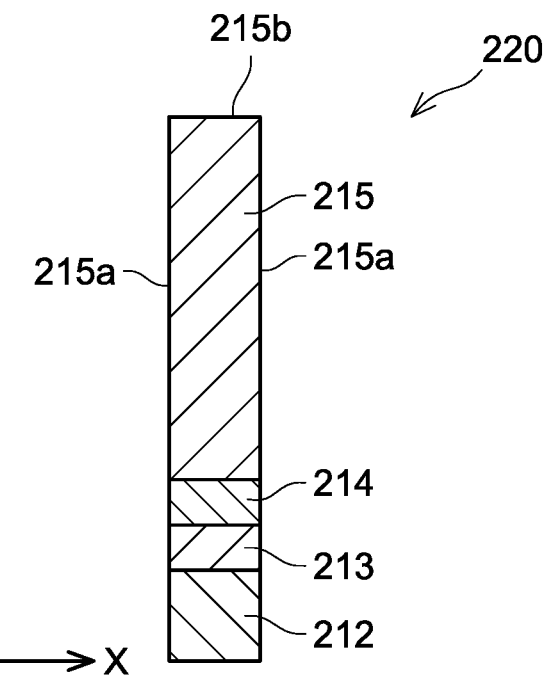
FIG. 20 is an explanatory diagram of the growing method in the fourth embodiment.

Next, the wafer 212, the buffer layer 213, the semiconductor layer 214, and the semiconductor layer 215 are cut along a thickness direction of these layers. In other words, the wafer 212, the buffer layer 213, the semiconductor layer 214, and the semiconductor layer 215 are cut along cut lines 218 in FIG. 19 (cut lines extending from an upper surface 215b of the semiconductor layer 215 to a lower surface of the semiconductor layer 214 (i.e., the upper surface 213b of the buffer layer 213)). Although the cut lines 218 in FIG. 19 are perpendicular to the upper surface 215b of the semiconductor layer 215, the cutting may be performed along a direction inclined to the upper surface 215b of the semiconductor layer 215. In other words, the cutting can be performed along any direction, as long as the cut surface extend from the upper surface 215b of the semiconductor layer 215 to the lower surface of the semiconductor layer 214. For example, the cutting may be performed such that a certain crystal surface is exposed at the cut surface. Cutting the layers as above produces a cut piece 220 shown in FIG. 20. Both side surfaces of the cut piece 220 each correspond to a cut surface 215a.

As described above, the crystal defects 216 formed when the semiconductor layer 215 was grown are present in the semiconductor layer 215. The crystal defects 216 extend substantially parallel to the z direction, and thus extend substantially parallel to the cut surfaces 215a. The crystal defects 216 are therefore less likely to be exposed at the cut surfaces 215a. There are extremely few crystal defects 216 exposed at the cut surfaces 215a, and thus each cut surface 215a has a low crystal defect density.

Figure 21:
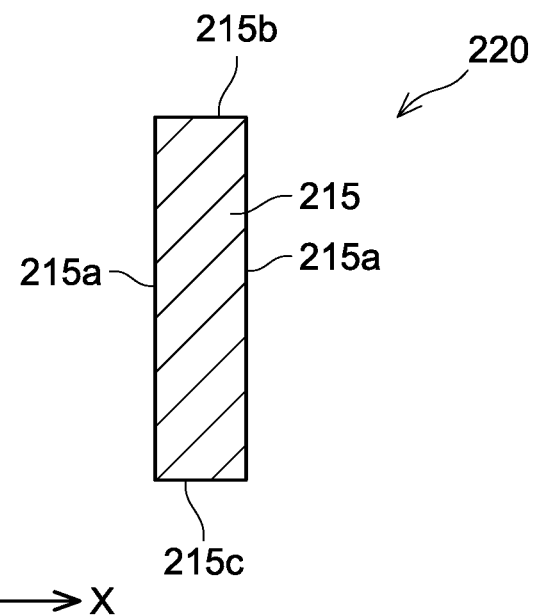
FIG. 21 is an explanatory diagram of the growing method in the fourth embodiment.

Next, as shown in FIG. 21, the semiconductor layer 214, the buffer layer 213, and the wafer 212 are removed from the semiconductor layer 215. The semiconductor layer 214, the buffer layer 213, and the wafer 212 can be removed, for example, by etching or polishing. Furthermore, the cut surfaces 215a of the semiconductor layer 215 are polished by the CMP. The cut surfaces 215a are thereby smoothed.

Figure 22:
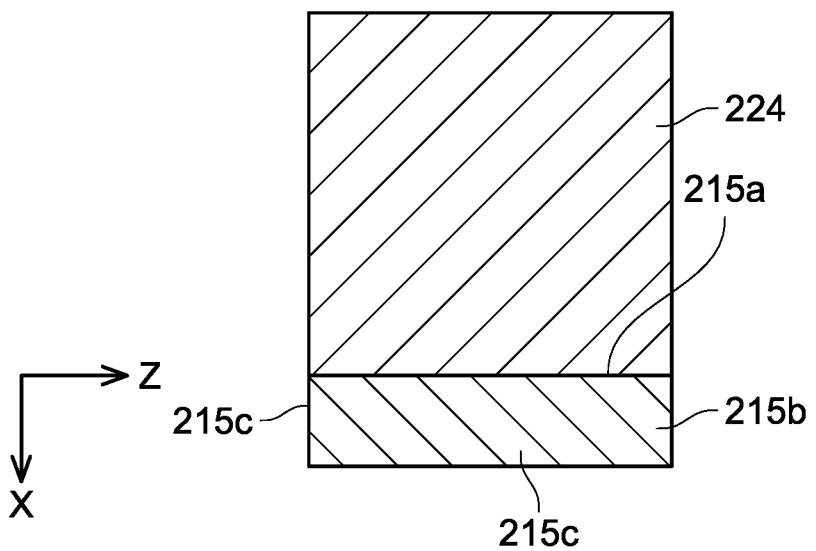
FIG. 22 is an explanatory diagram of the growing method in the fourth embodiment.

Next, as shown in FIG. 22, a semiconductor layer 224 constituted of gallium nitride is grown on one of the cut surfaces 215a of the semiconductor layer 215. In other words, the semiconductor layer 224 that is constituted of the same material and the same crystal structure as the semiconductor layer 215 is homoepitaxially grown on one of the cut surfaces 215a of the semiconductor layer 215. Here, the semiconductor layer 224 is grown by the HVPE. The cut surface 215a of the semiconductor layer 215 has a low crystal defect density and there is no mismatch in the lattice constant between the semiconductor layer 215 and the semiconductor layer 224, so crystal defects are less likely to be formed in the growing semiconductor layer 224. Therefore, the semiconductor layer 224 having a low crystal defect density can be formed.

Figure 23:
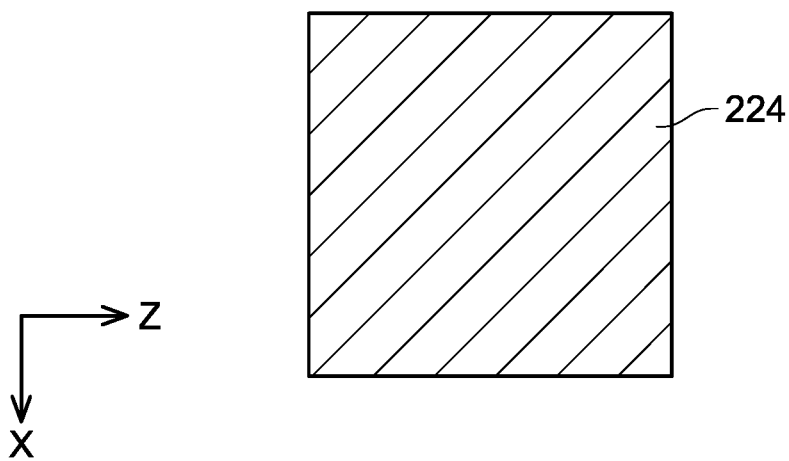
FIG. 23 is an explanatory diagram of the growing method in the fourth embodiment.

After the semiconductor layer 224 has been formed, the semiconductor layer 215 is removed from the semiconductor layer 224, as shown in FIG. 23. The semiconductor layer 215 can be removed, for example, by etching or polishing.

Next, the semiconductor layer 224 is subjected to cutting, polishing, etching, or the like, such that an arbitrary crystal surface is exposed. The semiconductor layer 224 manufactured as above can be used as a seed crystal. In other words, crystal pulling can be performed using the semiconductor layer 224 as a seed crystal, and a balk crystal of gallium nitride can be grown as a result. For example, ammonothermal growth can be performed using the semiconductor layer 224 as a seed crystal, and a balk crystal of gallium nitride can be grown as a result. Such a balk crystal may be processed into a wafer, and a semiconductor device may be manufactured with it.

The growing method of the fourth embodiment can efficiently manufacture a seed crystal that has few crystal defects and an aligned plane orientation.

Relationships between constituent elements in the fourth embodiment and constituent elements in the claims will be described. The buffer layer 213 in the fourth embodiment is an example of the crystal layer in the claims. The semiconductor layers 214, 215 in the fourth embodiment are an example of the first semiconductor layer in the claims. The semiconductor layer 224 in the fourth embodiment is an example of the second semiconductor layer in the claims. The wafer 212 in the fourth embodiment is an example of a base layer in the claims.

In the fourth embodiment described above, the buffer layer 213 is constituted of aluminum nitride. However, the buffer layer 213 may be constituted of silicon, α-aluminum oxide, or silicon carbide. Even when any of these materials is used as a base, the semiconductor layers 214, 215 constituted of gallium nitride can be suitably grown thereon.

Moreover, in the fourth embodiment described above, the wafer 212, the buffer layer 213, and the semiconductor layer 214 are removed from the semiconductor layer 215 after the cutting of the wafer 212, the buffer layer 213, the semiconductor layer 214, and the semiconductor layer 215. However, the wafer 212, the buffer layer 213, and the semiconductor layer 214 may be removed from the semiconductor layer 215 before the cutting.

Moreover, in the fourth embodiment described above, each of the semiconductor layers may be doped with n-type or p-type impurities.

Some of the features characteristic to the present disclosure will herein be listed. It should be noted that the respective technical elements are independent of one another, and are useful solely or in combinations.

An example of growing method disclosed herein may further include removing the substrate from the first semiconductor layer after the growth of the first semiconductor layer and before the growth of the second semiconductor layer.

Removing the substrate before the growth of the second semiconductor layer can prevent the second semiconductor layer having low crystallinity from being grown on the cut surface of the substrate.

In an example of growing method disclosed herein, the substrate may include a base layer, and the crystal layer may cover a surface of the base layer.

As above, the substrate may include a plurality of layers (the base layer and the crystal layer). In another example, an entirety of the substrate may be constituted of a sole crystal layer.

In an example of growing method disclosed herein, the first semiconductor layer and the second semiconductor layer may be constituted of a metastable material.

This configuration enables formation of a layer of metastable material, which has conventionally been difficult to form. In other words, the configuration enables formation of a layer of metastable material having a low crystal defect density.

In an example of growing method disclosed herein, the crystal layer may be constituted of α-aluminum oxide or α-iron oxide. Moreover, the first semiconductor layer and the second semiconductor layer may be constituted of α-gallium oxide.

This configuration enables formation of a α-gallium oxide layer (the second semiconductor layer) having a low crystal defect density.

In an example of growing method disclosed herein, the crystal layer may be constituted of α-aluminum oxide, gallium nitride, aluminum nitride, silicon carbide, yttria-stabilized zirconia, magnesium oxide, nickel oxide, strontium titanate, lithium niobate, lithium tantalate, tin oxide, titanium oxide, β-gallium oxide, or gadolinium gallium garnet. Moreover, the first semiconductor layer and the second semiconductor layer may be constituted of ε-gallium oxide.

This configuration enables formation of a ε-gallium oxide layer (the second semiconductor layer) having a low crystal defect density.

In an example of growing method disclosed herein, the crystal layer may be constituted of spinel. Moreover, the first semiconductor layer and the second semiconductor layer may be constituted of γ-gallium oxide.

This configuration enables formation of a γ-gallium oxide layer (the second semiconductor layer) having a low crystal defect density.

In an example of growing method disclosed herein, the crystal layer may be constituted of silicon, α-aluminum oxide, aluminum nitride, or silicon carbide. Moreover, the first semiconductor layer and the second semiconductor layer may be constituted of gallium nitride.

This configuration enables formation of a gallium nitride layer (the second semiconductor layer) having a low crystal defect density.

In an example of growing method disclosed herein, the second semiconductor layer may be grown by a hydride vapor phase epitaxy.

In another example of growing method disclosed herein, the second semiconductor layer may be grown by a mist CVD.

In an example of growing method disclosed herein, the second semiconductor layer may be doped with dopants.

An example of growing method disclosed herein may further include polishing the cut surface of the first semiconductor layer. The second semiconductor layer may be grown on the cut surface of the first semiconductor layer after the polishing.

Polishing the cut surface can make the cut surface smooth. Moreover, polishing the cut surface can eliminate flaws (a type of crystal defects) formed near the cut surface when the cutting was performed. Therefore, growing the second semiconductor layer on the cut surface after the polishing results in the second semiconductor layer having fewer crystal defects.

An example of growing method disclosed herein may further include cutting the second semiconductor layer such that a cut surface of the second semiconductor layer extends from a front surface of the second semiconductor layer to a rear surface of the second semiconductor layer, and growing a third semiconductor layer on the cut surface of the second semiconductor layer. The third semiconductor layer may have a material and a crystal structure that are same as those of the second semiconductor layer.

This configuration enables formation of a semiconductor layer (the third semiconductor layer) having a lower crystal defect density.

A semiconductor device may be manufactured using the second semiconductor layer or the third semiconductor layer formed by any of the above-described growing methods. Moreover, a balk crystal may be grown using, as a seed crystal, the second semiconductor layer or the third semiconductor layer formed by any of the above-described growing methods.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A method of growing semiconductor layers, the method comprising:
   growing a first semiconductor layer on a surface of a substrate at which a crystal layer is exposed, wherein the first semiconductor layer is different from the crystal layer in at least one of a material and a crystal structure;
   cutting the first semiconductor layer such that a cut surface of the first semiconductor layer extends from a front surface of the first semiconductor layer to a rear surface of the first semiconductor layer; and
   growing a second semiconductor layer on the cut surface of the first semiconductor layer, wherein the second semiconductor layer has a material and a crystal structure that are the same as the material and the crystal structure of the first semiconductor layer, respectively;
   wherein the crystal layer is constituted of α-aluminum oxide or α-iron oxide, and
   wherein the first semiconductor layer and the second semiconductor layer are constituted of α-gallium oxide.

2. The method of claim 1, further comprising removing the substrate from the first semiconductor layer after the growth of the first semiconductor layer and before the growth of the second semiconductor layer.

3. The method of claim 1, wherein
   the substrate comprises a base layer, and
   the crystal layer covers a surface of the base layer.

4. The method of claim 1, wherein the first semiconductor layer and the second semiconductor layer are constituted of a metastable material.

5. The method of claim 1, wherein the second semiconductor layer is grown by a hydride vapor phase epitaxy.

6. The method of claim 1, wherein the second semiconductor layer is grown by a mist chemical vapor deposition (CVD).

7. The method of claim 1, wherein the second semiconductor layer is doped with dopants.

8. The method of claim 1, further comprising polishing the cut surface of the first semiconductor layer,
   wherein the second semiconductor layer is grown on the cut surface of the first semiconductor layer after the polishing.

9. The method of claim 1, further comprising:
   cutting the second semiconductor layer such that a cut surface of the second semiconductor layer extends from a front surface of the second semiconductor layer to a rear surface of the second semiconductor layer; and
   growing a third semiconductor layer on the cut surface of the second semiconductor layer, wherein the third semiconductor layer has a material and a crystal structure that are same as those of the second semiconductor layer.

10. The method of claim 9, further comprising removing the first semiconductor layer from the second semiconductor layer after the growth of the second semiconductor layer and before the growth of the third semiconductor layer.

11. A method of manufacturing a semiconductor device, wherein
    the method uses the second semiconductor layer formed by the method of claim 1.

12. A method of manufacturing a semiconductor device, wherein
    the method uses the third semiconductor layer formed by the method of claim 9.

13. A method of growing a balk crystal, wherein
    the method uses, as a seed crystal, the second semiconductor layer formed by the method of claim 1.

14. A method of growing a balk crystal, wherein the method uses, as a seed crystal, the third semiconductor layer formed by the method of claim 9.

* * * * *